(12) United States Patent  
Fujimoto

(10) Patent No.: US 6,522,389 B2
(45) Date of Patent: Feb. 18, 2003

(54) SCANNING EXPOSURE PHOTO-MASK AND METHOD OF SCANNING EXPOSURE AND SCANNING EXPOSURE SYSTEM

(75) Inventor: Masashi Fujimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/794,910

(22) Filed: Feb. 28, 2001

(65) Prior Publication Data

US 2001/0010578 A1 Aug. 2, 2001

Related U.S. Application Data

(62) Division of application No. 09/287,583, filed on Apr. 6, 1999.

(30) Foreign Application Priority Data

Apr. 6, 1998 (JP) .............................. 10-93700

(51) Int. Cl.⁷ ........................ G03B 27/42; G03B 27/52; G03B 27/54; G03B 27/32
(52) U.S. Cl. ............................ 355/53; 355/55; 355/67; 355/77
(58) Field of Search .............................. 355/53, 52, 55, 355/67–71, 77; 430/5, 20, 22, 30; 356/399–401

(56) References Cited

U.S. PATENT DOCUMENTS

| 3,541,338 | A |   | 11/1970 | Duda et al. |
| 4,758,863 | A | * | 7/1988 | Nikkel ........................ 355/40 |
| 4,841,341 | A |   | 6/1989 | Ogawa et al. |
| 4,905,041 | A |   | 2/1990 | Aketagawa |
| 5,160,957 | A |   | 11/1992 | Ina et al. |
| 5,476,736 | A |   | 12/1995 | Tanabe |
| 5,498,501 | A |   | 3/1996 | Shimoda et al. |
| 5,539,497 | A |   | 7/1996 | Nishi |
| 5,673,103 | A |   | 9/1997 | Inoue et al. .................. 355/71 |
| 5,726,741 | A |   | 3/1998 | Kye et al. |
| 5,849,437 | A |   | 12/1998 | Yamazaki et al. |
| 5,854,671 | A | * | 12/1998 | Nishi .......................... 355/53 |
| 5,883,700 | A |   | 3/1999 | Someya |
| 5,933,219 | A | * | 8/1999 | Unno .......................... 355/71 |
| 5,995,200 | A | * | 11/1999 | Pierrat ........................ 355/53 |
| 6,020,092 | A |   | 2/2000 | Sakoh |
| 6,074,787 | A |   | 6/2000 | Takeuchi |
| 6,078,381 | A |   | 6/2000 | Suzuki |
| 6,090,527 | A |   | 7/2000 | Yamazaki et al. |

FOREIGN PATENT DOCUMENTS

| JP | 62-32031 | 8/1994 |
| JP | 8-44038 | 2/1996 |

* cited by examiner

Primary Examiner—Hung Henry Nguyen
(74) Attorney, Agent, or Firm—Young & Thompson

(57) ABSTRACT

A scanning exposure system to expose an objective wafer has a light source; a slit-shaped window having a length in a first direction greater than a width in a second direction perpendicular to the first direction; a photomask having an exposure opening therein, the exposure opening having a length along a longer direction greater than a width along a narrower direction perpendicular to the longer direction, the longer direction being aligned parallel to a projection of the first direction on the photomask, the objective wafer being exposed to the light source through the slit-shaped window and the exposure opening during a scanning operation by a relative motion of the photomask with respect to the slit-shaped window in a second direction perpendicular to the first direction.

10 Claims, 11 Drawing Sheets

100
SCANNING EXPOSURE PHOTO-MASK AND METHOD OF SCANNING EXPOSURE AND SCANNING EXPOSURE SYSTEM

CROSS-REFERENCE TO RELATED APPLICATIONS

This application is a division of copending application Ser. No. 09/287,583, filed Apr. 6, 1999.

BACKGROUND OF THE INVENTION

The present invention relates to a scanning exposure photo-mask, and a scanning exposure system as well as a method of scanning an exposure beam by a scanning exposure system.

Variation in width of the line-shaped patterns over a chip is due to the coma in the projection lens such as a reduced projection lens. The coma is caused by a displacement in focusing position between a light transmitted through an optical axis of a reducing projecting lens and an oblique light transmitted at an oblique angle to the optical axis through the reducing projecting lens. As the incident angle to the optical axis is increased, the displacement in focusing position is also increased, whereby a blooming appears. The influence of coma is larger on opposite ends in the longitudinal direction of the line-shaped pattern due to a larger distance from the optical axis than the influence of coma on opposite sides in the width direction of the line-shaped pattern. If the exposure light beam defined by the slit is scanned in a longitudinal direction of the line-shaped pattern, then the influence of coma is larger on opposite ends in the longitudinal direction of the line-shaped pattern due to a larger distance from the optical axis than the influence of coma on opposite sides in the width direction of the line-shaped pattern. This influence of coma prevents a highly accurate exposure and a dimension of the exposure pattern is deteriorated. The center region pattern has no variation in actual dimension from the predetermined dimension. The peripheral region pattern is reduced in width from the predetermined width.

SUMMARY OF THE INVENTION

Accordingly, it is an object of the present invention to provide a novel scanning exposure photo-mask free from any substantive influence of coma.

It is a further object of the present invention to provide a novel scanning exposure system free from any substantive influence of coma.

It is a still further object of the present invention to provide a novel method of scanning an exposure beam by a scanning exposure system free from any substantive influence of coma.

The present invention provides a scanning exposure photo-mask having an exposure pattern which has a longitudinal direction. The scanning exposure photo-mask is placed in an exposure system so that the longitudinal direction of the pattern is parallel to a longitudinal direction of a slit of the exposure system.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first present invention provides a scanning exposure photo-mask having an exposure pattern which has a longitudinal direction. The scanning exposure photo-mask is placed in an exposure system so that the longitudinal direction of the pattern is parallel to a longitudinal direction of a slit of the exposure system.

It is preferable that the exposure pattern comprises plural line-shaped patterns extending in a first direction along which the slit extends and the line-shaped patterns are aligned in a second direction perpendicular to the first direction.

It is also preferable that the exposure pattern comprises one of a word line pattern and a bit line pattern.

The first present invention is applicable to a scanning exposure system having a slit plate having a slit and a photo-mask stage mounted thereon with the above novel scanning exposure photo-mask.

It is also preferable that the photo-mask stage allows mounting the scanning exposure photo-mask in two different directions perpendicular to each other.

It is also preferable that the photo-mask stage and an objective stage mounting an objective sample for exposure are capable of allowing that the longitudinal direction of the exposure pattern of the photo-mask and a longitudinal direction of an exposed pattern on the objective sample are directed in correspondence with the longitudinal direction of the slit.

It is also preferable that the objective stage is moved by a rotational driving unit for rotating the objective stage by at least an angle of 90 degrees and an X-Y driving unit for moving the objective stage in plane.

The second present invention provides a method of scanning an exposure beam defined by a slit with reference to a photo-mask having an exposure pattern which has a longitudinal direction, so that the longitudinal direction of the exposure pattern is kept parallel to a longitudinal direction of the slit during a scanning operation.

It is preferable that the slit is fixed in position, and the photomask is moved in a direction perpendicular to the longitudinal direction, and an objective sample for exposure is moved in an opposite direction to the direction of movement of the photo-mask.

In accordance with the present invention, the longitudinal direction of the patterns of the photo-mask is parallel to the longitudinal direction of the slit so that scanning and an exposure are carried out to make the longitudinal direction of the slit correspond to the longitudinal direction of the exposure pattern whereby influences of comas between center and end portions of a light beam defined by the slit are suppressed, resulting in almost no variations in dimension and shape of the patterns. This realizes a highly accurate exposure and transfer of the patterns.

Figure 7:
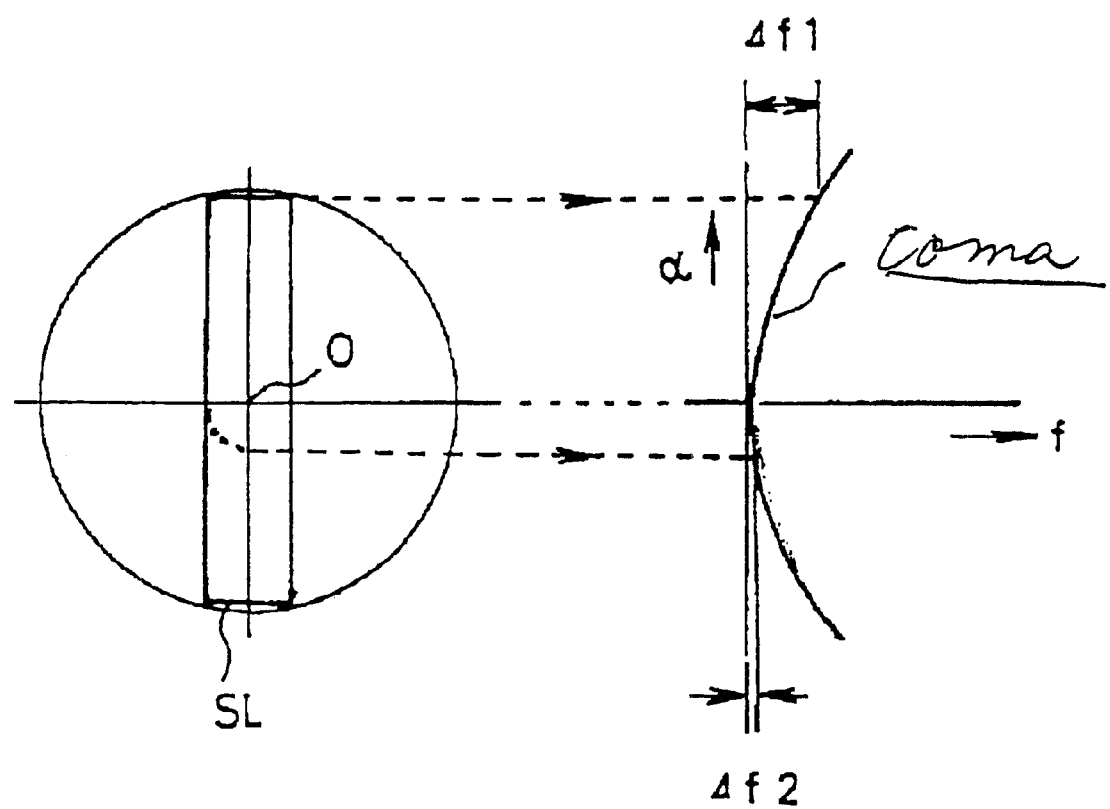
FIG. 7 is a view illustrative of a mechanism of coma, wherein a horizontal axis represents a focusing position on an optical axis and a vertical axis represents an incident angle to the optical axis of the light.
Figure 8:
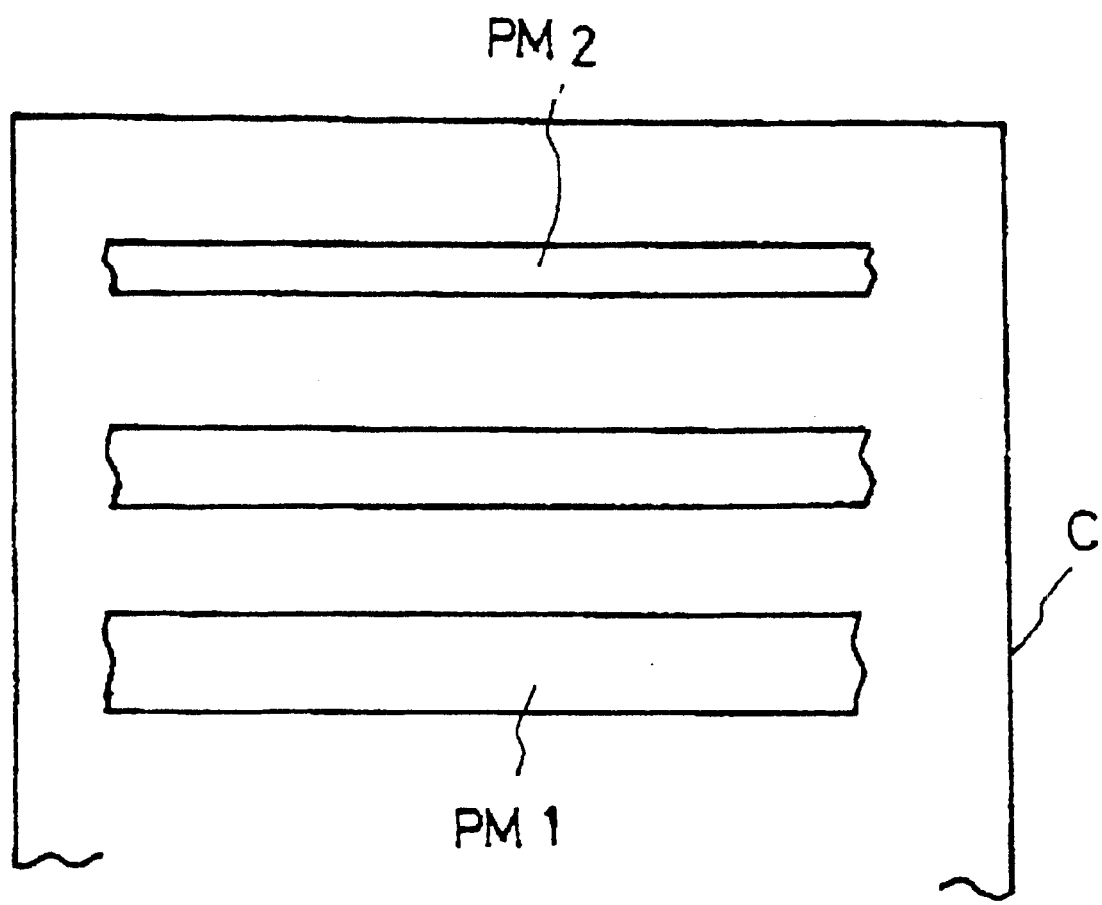
FIG. 8 is a view illustrative of center region patterns and peripheral region patterns.

The cause of variation in width of the line-shaped patterns over chip is the coma in the projection lens such as a reduced projection lens. The coma is caused by a displacement in focusing position between a light transmitted through an optical axis of a reducing projecting lens and an oblique light transmitted in an oblique angle to the optical axis through the reducing projecting lens. FIG. 7 is a view illustrative of a mechanism of coma, wherein a horizontal axis represents a focusing position on an optical axis and a vertical axis represents an incident angle to the optical axis of the light. As the incident angle to the optical axis is increased, the displacement in focusing position is also increased, whereby a blooming appears. The influence of coma is larger on opposite ends in the longitudinal direction of the line-shaped pattern due to a larger distance from the optical axis than the influence of coma on opposite sides in the width direction of the line-shaped pattern. If the exposure light beam defined by the slit is scanned in a longitudinal direction of the line-shaped pattern, then the influence of coma is larger on opposite ends in the longitudinal direction of the line-shaped pattern due to a larger distance from the optical axis than the influence of coma on opposite sides in the width direction of the line-shaped pattern. This influence of coma prevents a highly accurate exposure and a dimension of the exposure pattern is deteriorated. FIG. 8 is a view illustrative of center region patterns and peripheral region patterns. The center region pattern PM1 has no variation in actual dimension from the predetermined dimension. The peripheral region pattern PM2 is reduced in width from the predetermined width.

The scanning exposure photo-mask in accordance with the present invention has an exposure pattern which has a longitudinal direction. The scanning exposure photo-mask is placed in an exposure system so that the longitudinal direction of the pattern is parallel to a longitudinal direction of a slit of the exposure system. The exposure pattern comprises plural line-shaped patterns extending in a first direction along which the slit extends and the line-shaped patterns are aligned in a second direction perpendicular to the first direction. The exposure pattern comprises one of a word line pattern and a bit line pattern. The scanning exposure system has a slit plate having a slit and a photo-mask stage mounted thereon with the above novel scanning exposure photo-mask. The photo-mask stage allows mounting the scanning exposure photo-mask in two different directions perpendicular to each other. The photo-mask stage and an objective stage mounting an objective sample for exposure are capable of allowing that the longitudinal direction of the exposure pattern of the photo-mask and a longitudinal direction of an exposed pattern on the objective sample are directed in correspondence with the longitudinal direction of the slit. The objective stage is moved by a rotational driving unit for rotating the objective stage by at least an angle of 90 degrees and an X-Y driving unit for moving the objective stage in plane. Scanning an exposure beam defined by a slit with reference to a photo-mask having an exposure pattern which has a longitudinal direction is carried out, so that the longitudinal direction of the exposure pattern is kept in parallel to a longitudinal direction of the slit during a scanning operation. The slit is fixed in position, and the photo-mask is moved in a direction perpendicular to the longitudinal direction, and an objective sample for exposure is moved in an opposite direction to the direction of movement of the photo-mask. Namely, the longitudinal direction of the patterns of the photo-mask is parallel to the longitudinal direction of the slit so that a scanning and an exposure are carried out to make the longitudinal direction of the slit correspond to the longitudinal direction of the exposure pattern whereby influences of comas between center and end portions of a light beam defined by the slit are suppressed, resulting in almost no variations in dimension and shape of the patterns. This realizes a highly accurate exposure and transfer of the patterns.

An embodiment according to the present invention will be described in detail with reference to FIG. 1 which is a front view illustrative of a scanning exposure system. FIG. 2 is a fragmentary perspective view illustrative of a part of the scanning exposure system of FIG. 1. The scanning exposure system 100 has a light source 101 for emitting an ultraviolet ray. The ultraviolet ray emitted from the light source 101 is reflected by a reflective mirror 102. The reflected light is transmitted through a condensed lens 103 whereby the reflected light becomes a parallel beam. A slit plate 104 is provided on an optical axis "O" so that a slender slit of the slit plate 104 is directed along a Y-direction on a plane including the optical axis "O". The parallel beam is then transmitted through the slit SL of the slit plate 104. A mask stage 105 is also provided on the optical axis "O" and under the slit plate 104. The mask stage 105 is movable by a mask stage driver unit 106 so that the mask stage 105 shows a linear movement at a constant speed in an X-direction on the plane. The mask stage 105 has a photo-mask PM having a predetermined pattern. A scanning of the mask pattern in the X-direction can be carried out by the movement of the mask stage 105. A reduction projecting lens 107 is placed on the optical axis "O" and under the mask stage 105 so that the pattern of the photo-mask is reduced in size and projected onto the wafer to form a size-reduced image. The wafer is mounted on the wafer stage 108.

The wafer stage 108 is positioned with reference to an orientation flat (or) of the wafer "W". The wafer stage 108 is also mounted on a θ-direction driver unit 110. The θ-direction driver unit 110 is further mounted on an X-Y driver unit 111. A wafer stage driver unit 109 is provided for moving or driving both the θ-direction driver unit 110 and the X-Y driver unit 111. The wafer stage 108 is rotatable by 90 degrees by the θ-direction driver unit 110. The wafer stage 108 is also movable in the X-Y directions. The mask stage driver 106 and the wafer stage driver 109 are connected to a controller for controlling the operations of the mask stage driver 106 and the wafer stage driver 109. The scanning exposure system 100 further has additional features for adjusting the focusing point of the wafer stage 108.

With reference to FIG. 2, the photo-mask PM has a pattern corresponding to a pattern to be formed on the wafer (w). The reduced projection lens 107 has such a reduction ratio that an image in the predetermined size is formed on the wafer. The wafer has a surface applied with a photo-resist. The ultraviolet ray emitted from the light source 101 is defined in beam-shape by the slit SL of the slit plate 104. The defined light beam is then irradiated onto the photo-mask PM having the predetermined pattern. The light beam is then transmitted through the reduced projection lens 107 and then irradiated on the photo-resist on the surface of the wafer "W". Concurrently, the controller 112 (FIG. 1) controls the mask stage driver 106 to move the photo-mask PM on the mask stage 105 in the X-direction at the constant speed. In synchronization with this controlled operation, the X-Y driver unit 111 is controlled by the wafer driver 109 to move the wafer "W" in an opposite direction to the X-direction of the photo-mask PM.

The photo-mask PM is scanned with reference to the light beam transmitted through the slit SL so that the photo-mask pattern is projected onto the semiconductor wafer "W" with the scanning, whereby an exposure for one chip to the photo-resist on the wafer surface is carried out. After the one chip exposure has been completed, then the wafer is moved by one chip size in the Y-direction by the X-Y driver unit 111 and subsequently the photo-mask PM is moved in an opposite direction to the X-direction. In synchronizing with this movement, the wafer "W" is moved in the X-Y direction y the X-Y driver unit 111 whereby the next one chip exposure is carried out in an adjacent chip region of the previously exposed chip region. The above operations will be repeated until all of the chip regions are exposed. The scanning speed vP of the photo-mask PM and the scanning speed of the wafer vW and the magnification "m" of the reduced projection lens 107 are so decided as to comply with the relationship vP=vW×m, whereby the pattern of the photo-mask PM has an equivalent reduction magnification in X-direction and Y-direction.

Figure 1:
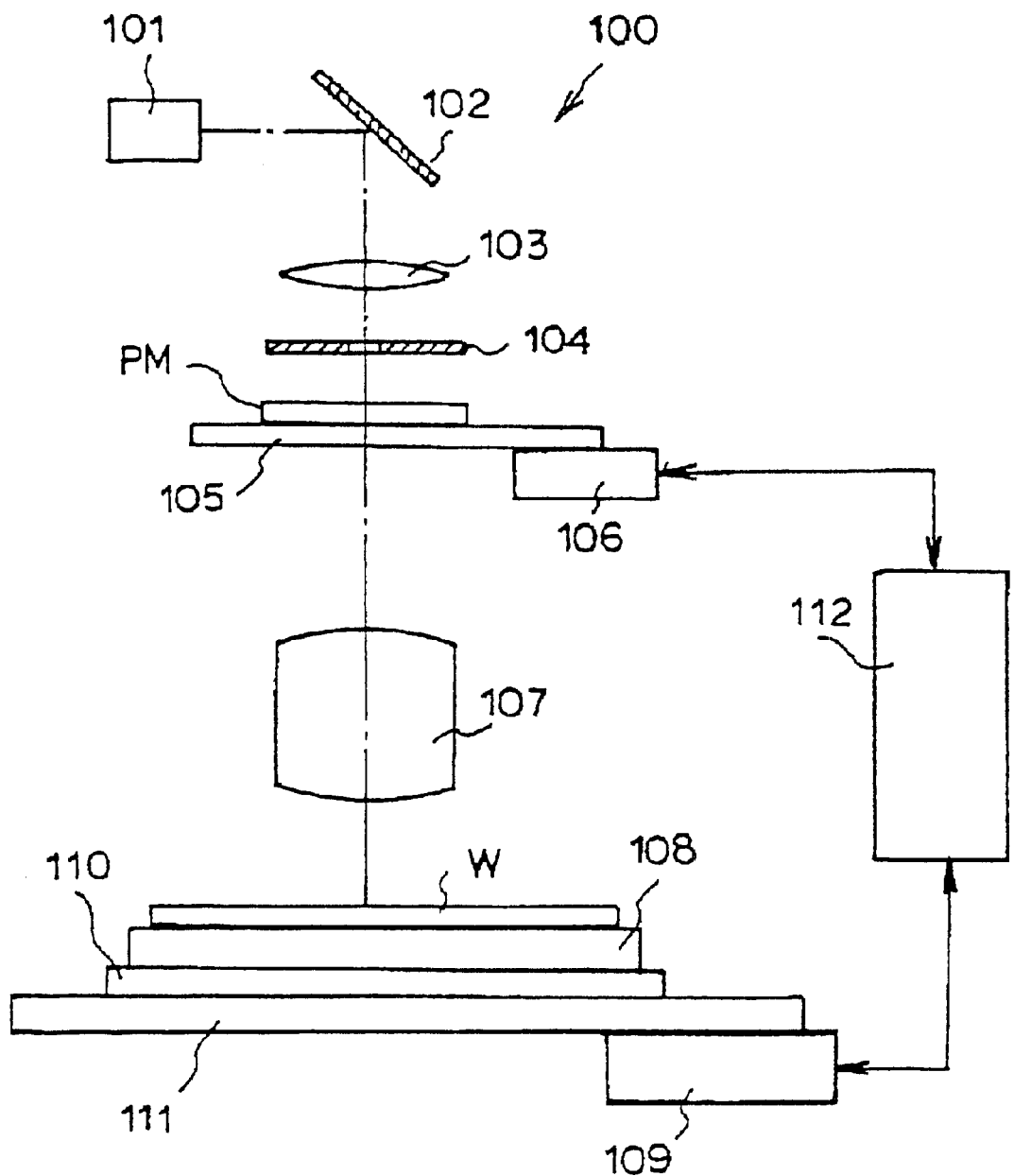
FIG. 1 which is a front view illustrative of a scanning exposure system in accordance with the present invention.
Figure 2:
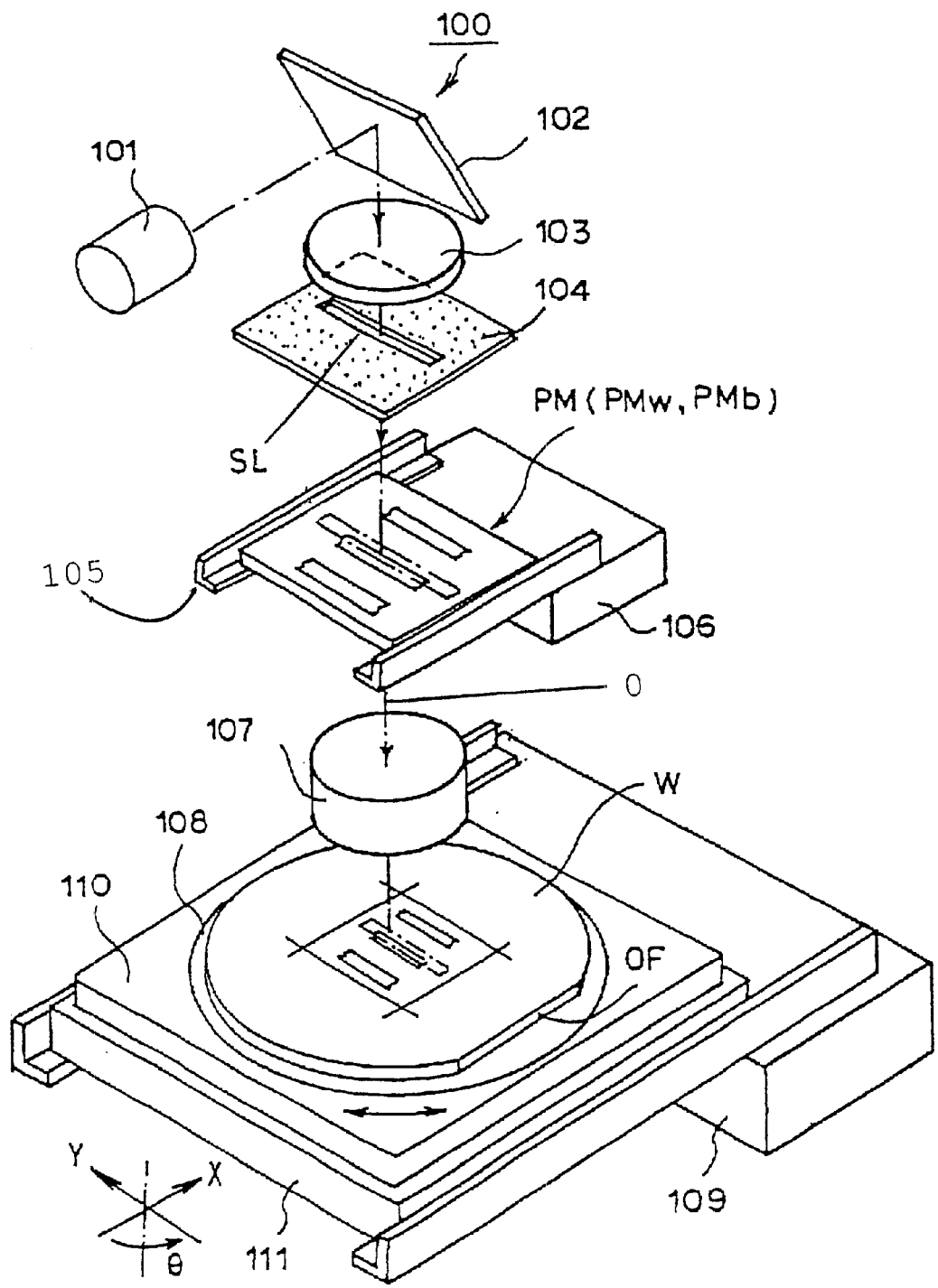
FIG. 2 is a fragmentary perspective view illustrative of a part of the scanning exposure system of FIG. 1.
Figure 3:
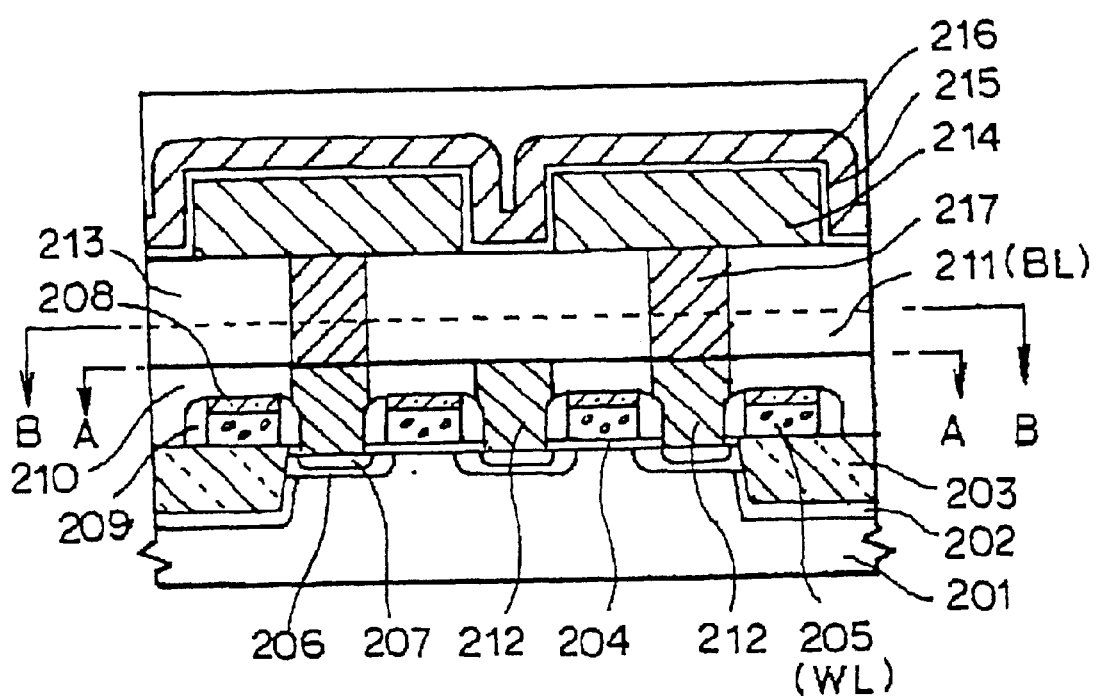
FIG. 3 is a fragmentary cross sectional elevation view illustrative of a memory cell having word and bit lines to be exposed by the scanning exposure system of FIG. 1.
Figure 4A:
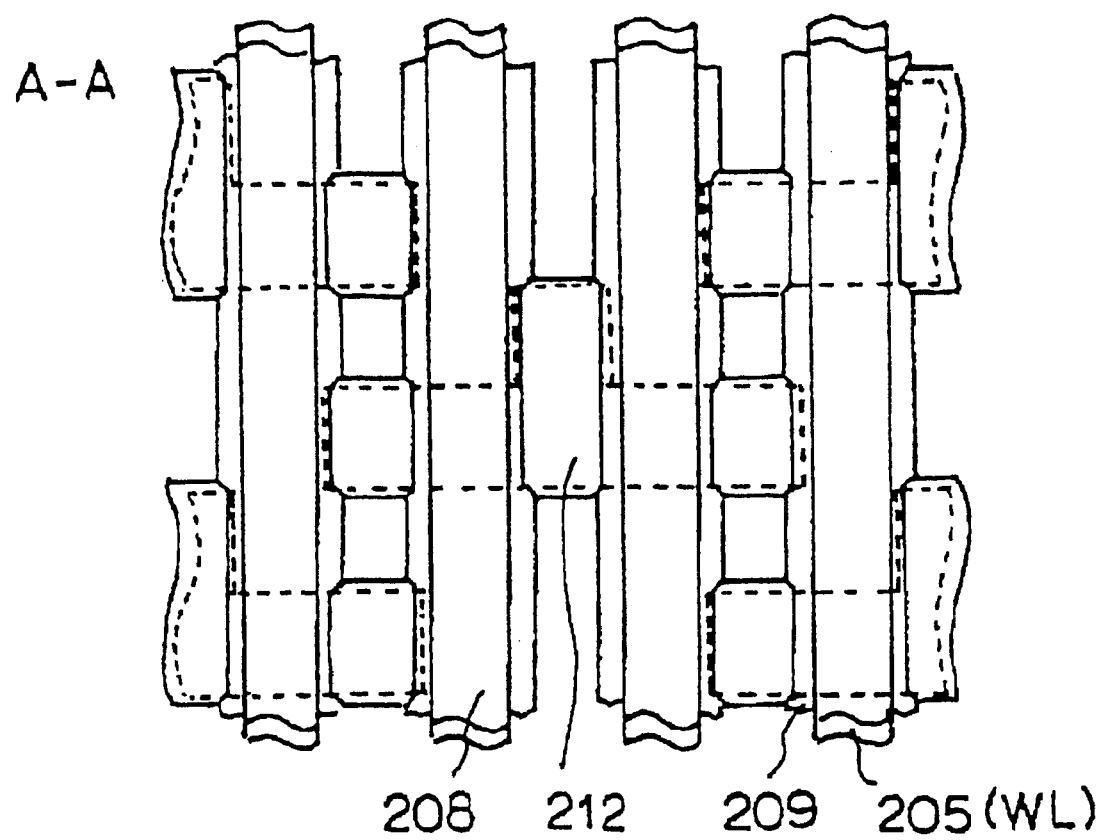
FIG. 4A is a fragmentary cross sectional elevation view illustrative of the memory cell taken along an A—A line of FIG. 3.
Figure 4B:
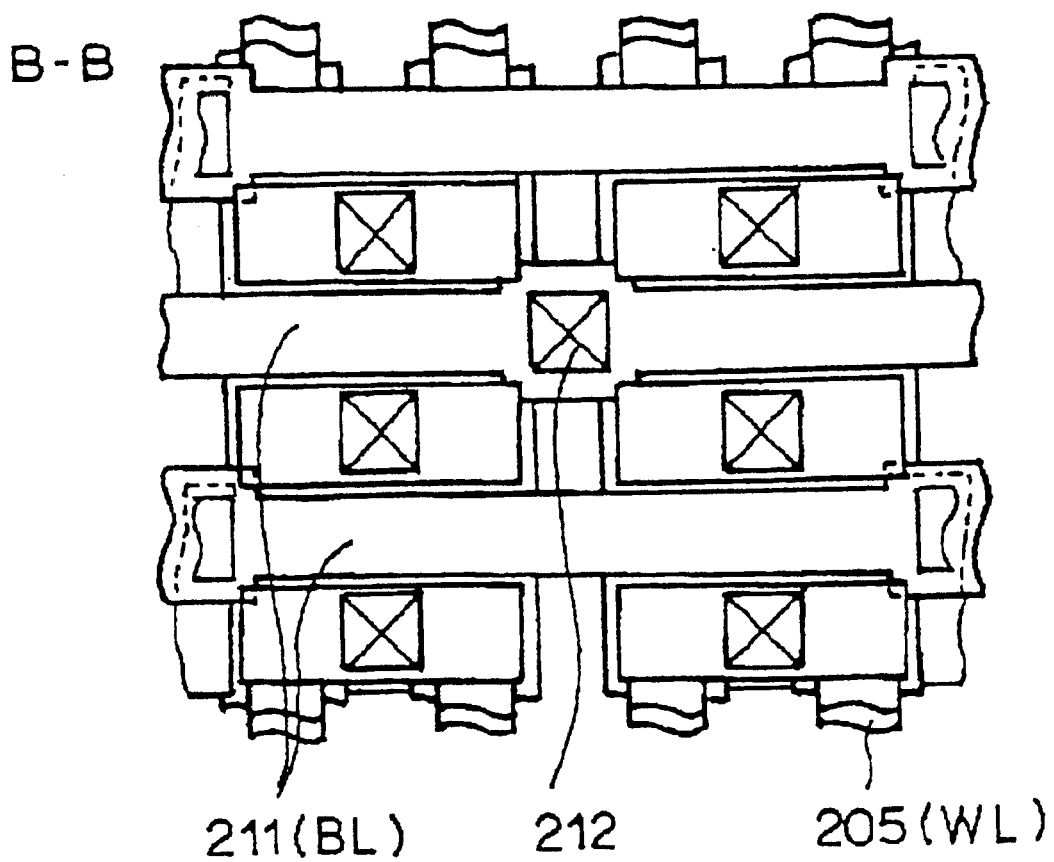
FIG. 4B is a fragmentary cross sectional elevation view illustrative of the memory cell taken along a B—B line of FIG. 3.

FIG. 3 is a fragmentary cross sectional elevation view illustrative of a memory cell having word and bit lines to be exposed by the scanning exposure system of FIG. 1. Capacitors for storing data are formed above the bit lines. FIG. 4A is a fragmentary cross sectional elevation view illustrative of the memory cell taken along an A—A line of FIG. 3. FIG. 4B is a fragmentary cross sectional elevation view illustrative of the memory cell taken along a B—B line of FIG. 3. p⁻-diffusion layers 202 and field oxide layers 203 are formed in a p-type silicon substrate 201 to define a device region. A gate oxide film 204 is formed on the device region on the silicon substrate 201. A gate electrode 205 as a word line (wL) is formed on the gate oxide film 204. The gate electrode 205 extends in the Y-direction which is perpendicular to the orientation flat of the wafer "W". The width of the gate electrode 205 as the word line is about 0.2 micrometers. The gate electrodes 205 as the word lines are aligned at a constant pitch of about 0.2 micrometers. Source and drain diffusion layers 206 and 207 are formed in the device region of the silicon substrate 201. Laminations of silicon oxide layers 208 and 209 are provided which cover the gate electrodes 205. A first inter-layer insulator 210 is provided over the laminations of the silicon oxide layers 208 and 209. Interconnections 211 as the bit lines BL are provided which extend over the first inter-layer insulator 210 in the X-direction which is parallel to the orientation flat of the wafer "W". The bit line has a width of about 0.2 micrometers and the bit lines are aligned at a constant pitch in the range of 0.15–0.2 micrometers. First conductive plugs 212 are formed in the first inter-layer insulator 210 so that the bit lines are connected through the first conductive plugs 210 to the diffusion layers 207 in the semiconductor substrate 201. A second inter-layer insulator 213 is provided over the bit lines. Storage electrodes 214 are provided on the second inter-layer insulator 213. A dielectric film 215 is then formed on the storage electrodes 214. A common electrode 216 is further provided on the dielectric film 215 to form storage capacitors over the bit lines. Second conductive plugs 217 are formed in the second inter-layer insulator 213 so that the storage electrodes 214 are connected through the second and first conductive plugs 217 and 212 to the diffusion layers 207.

Figure 5A:
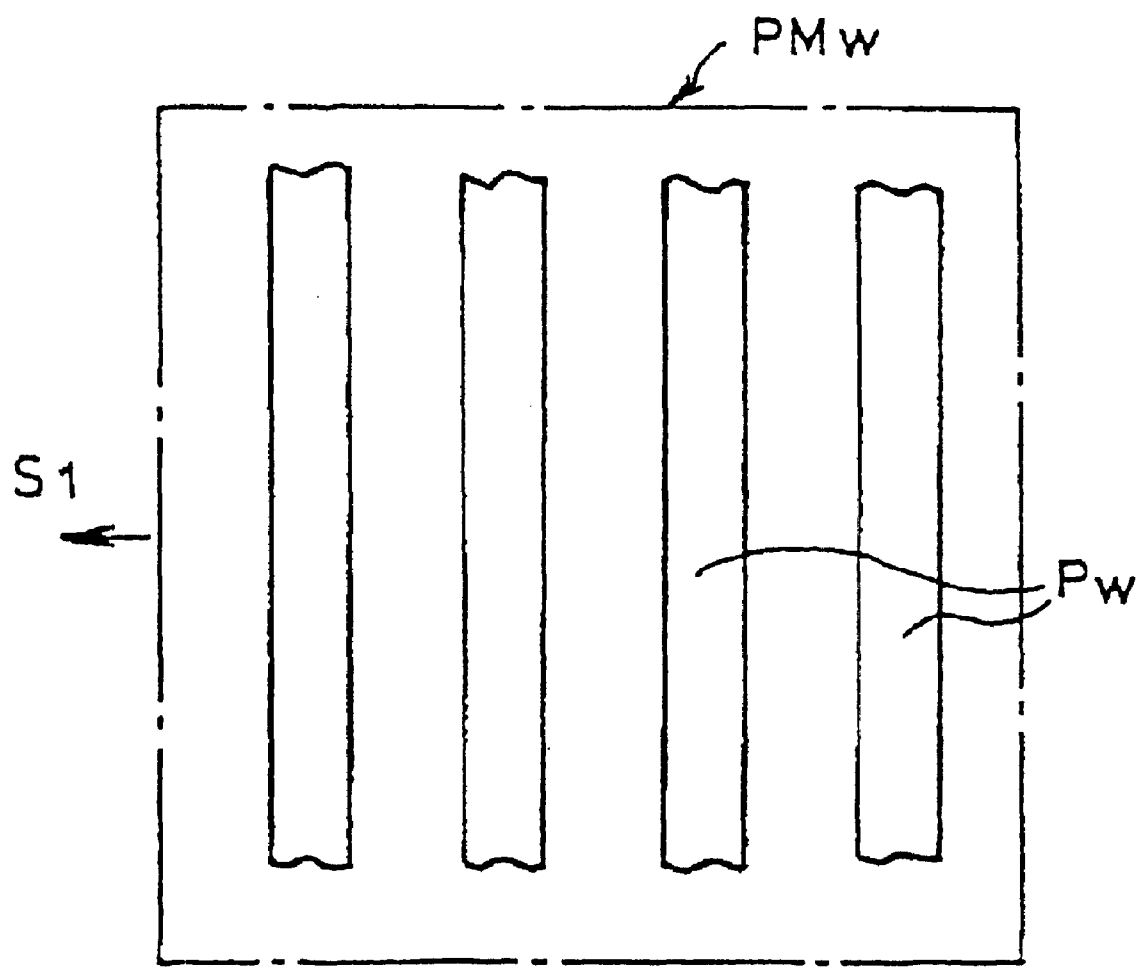
FIG. 5A is a plan view illustrative of a photo-mask having a word pattern for forming word lines of the semiconductor memory device of FIG. 3.
Figure 5B:
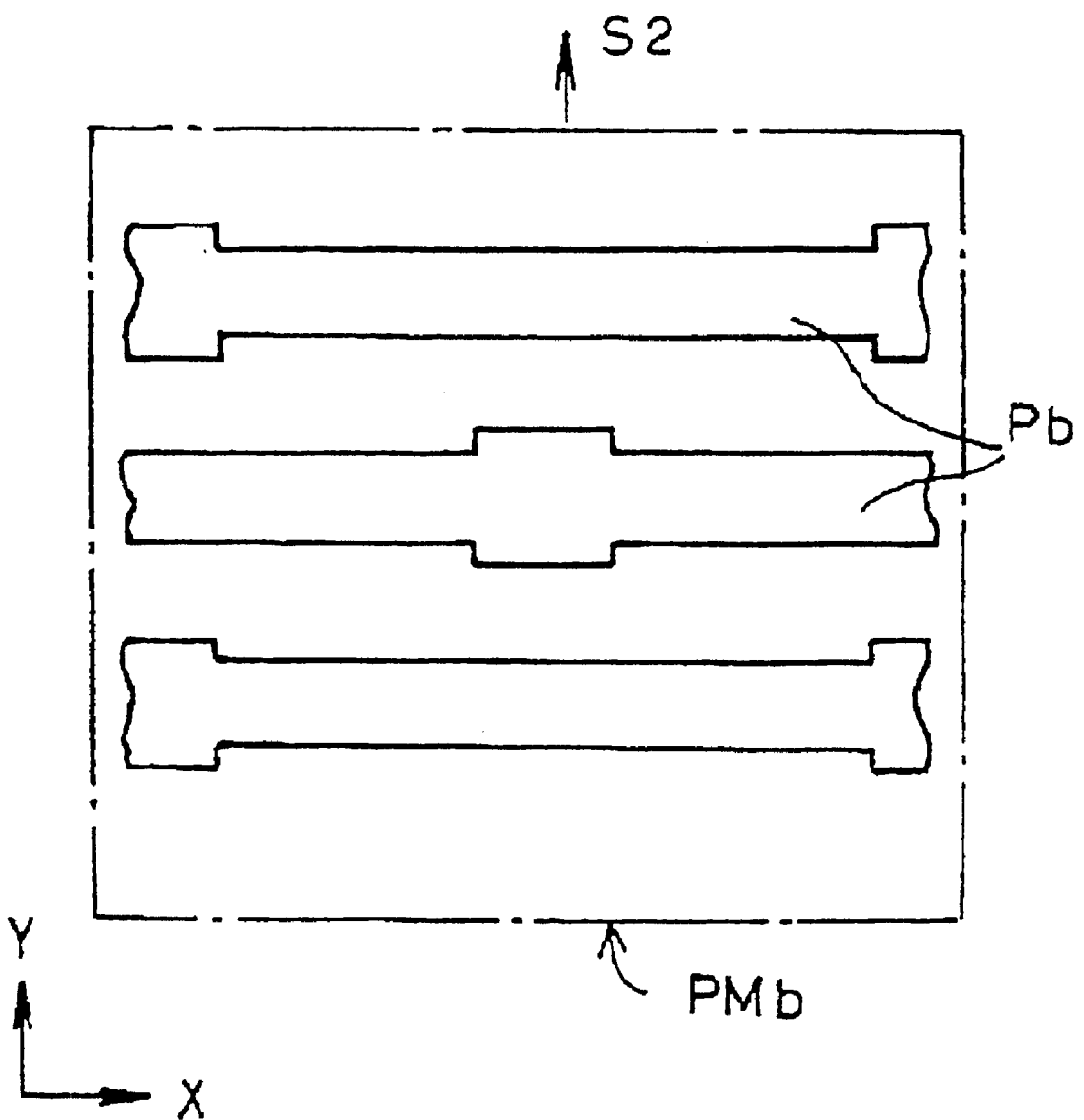
FIG. 5B is a plan view illustrative of a photo-mask having a bit pattern for forming bit lines of the semiconductor memory device of FIG. 3.
Figure 6A:
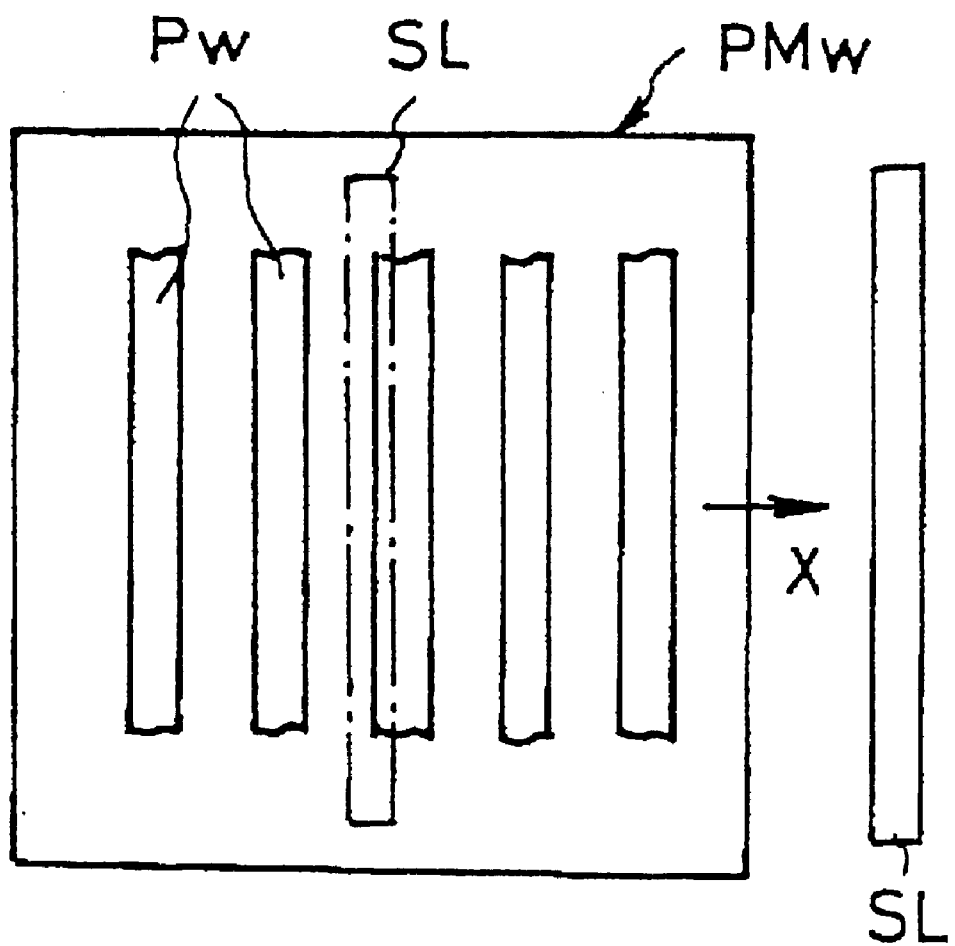
FIG. 6A is a plan view illustrative of the scanning of the mask stage mounted thereon with the word line photo-mask to move the mask stage with reference to the slit of the slit plate.

FIG. 5A is a plan view illustrative of a photo-mask having a word pattern for forming word lines of the semiconductor memory device of FIG. 3. FIG. 5B is a plan view illustrative of a photo-mask having a bit pattern for forming bit lines of the semiconductor memory device of FIG. 3. The word line photo-mask PMw has line-shaped light transmission patterns Pw in correspondence with the word lines WL. The bit line photo-mask PMb has line-shaped light transmission patterns Pb in correspondence with the bit lines BL. The bit line pattern has an expanding position which is positioned in correspondence with a position where a contact hole is formed. These photo-masks are mounted on the mask stage 105. The word line photo-mask PMw is inserted in a direction S1 from a right side of the mask stage 105 so that the longitudinal direction of the word line patterns are directed to the Y-direction. FIG. 6A is a plan view illustrative of the scanning of the mask stage mounted thereon with the word line photo-mask PMw to move the mask stage with reference to the slit SL of the slit plate. The mask stage is moved in the X-direction so that the word line patterns PW of the photo-mask PMw remains directed parallel to the longitudinal direction of the slit SL of the slit plate. The light beam transmitted through the slit SL is then transmitted through the reduced projecting lens 107 to form the image onto the wafer surface. The word line patterns PW are reduced in size to form the image on the wafer surface. In synchronizing with the movement of the mask stage 105 in the X-direction, the wafer stage 108 is moved in the opposite direction to the X-direction so that the word line patterns PW are scanned over the wafer surface with movement in the X-direction of the mask stage 105 to carrying out the exposure of the chip region.

As illustrated in FIG. 6A, the longitudinal direction of the word line pattern PW is in the Y-direction and the longitudinal direction of the slit SL is also in the Y-direction, for which reason even if a coma appears on the reduction projecting lens 107, this coma provides substantially no influence to the dimension of the width of the defined light beam transmitted through the slit SL because of a short distance from the optical axis in the width direction of the defined light beam defined by the slit, for which reason the word line patterns are uniform in width over the entire regions of the wafer. Even if the comas due to the opposite ends of the slit provide influences to the opposite ends of the word line patterns PW, the defined light beam transmitted by the slit SL is irradiated with superimposition by scanning, for which reason the influence of the comas are small in the scanning direction. Therefore, almost no influence is caused due to the comas or the width dimension of the word line patterns PW. Even if an influence is caused, this influence is in the longitudinal direction of the word line patterns PW, whereby exposures at the opposite ends of the word line patterns are insufficient, resulting in a slight shortening of the length of the word line in the longitudinal direction. Usually, the opposite ends of the word lines are not in service, for which reason no substantial influence is caused by the influence of comas in the opposite ends of the word line patterns.

Figure 6B:
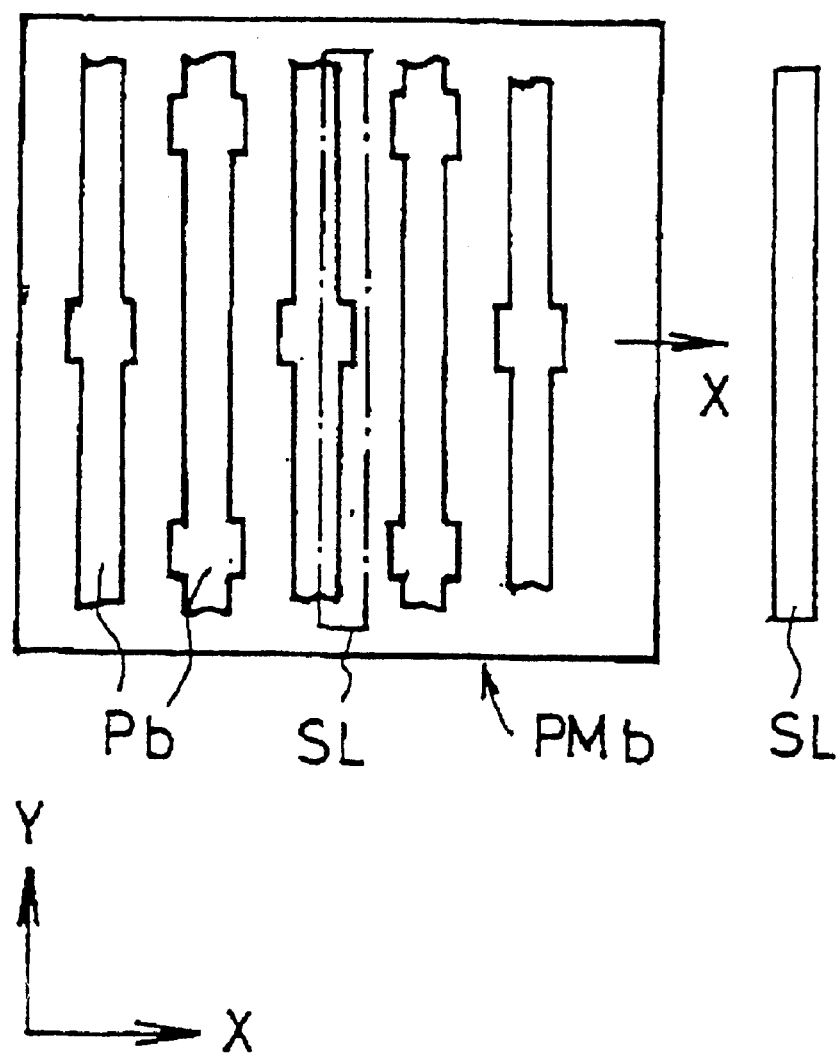
FIG. 6B is a plan view illustrative of the scanning of the mask stage mounted thereon with the bit line photo-mask to move the mask stage with reference to the slit of the slit plate.

The bit line photo-mask PMb is mounted onto the mask stage 105 in the direction S2 from the topside of the mask stage 105, so that the longitudinal direction of the bit line patterns is perpendicular to the longitudinal direction of the word line patterns. FIG. 6B is a plan view illustrative of the scanning of the mask stage mounted thereon with the bit line photo-mask PMb to move the mask stage with reference to the slit SL of the slit plate. The longitudinal direction of the bit line patterns Pb is in the Y-direction. The mask stage 105 is moved in the X-direction by the mask driver unit 106 for scanning the bit line photo-mask PMb with reference to the slit SL, so that the scanning is carried out so that the longitudinal direction is kept in correspondence with the longitudinal direction of the slit SL. The light beam defined by the slit SL is then transmitted through the reduction projecting lens with the dimensional reduction and then irradiated onto the wafer surface.

On the other hand, the wafer stage 108 is rotated by 90 degrees by the θ-driver unit 110 so that the wafer orientation flat becomes directed in the Y-direction and the wafer stage 108 is moved to the opposite direction to the X-direction, whereby the bit line patterns Pb are scanned over the semiconductor wafer surface. As a result, one chip exposure of the bit line patterns on the wafer is carried out. The bit line photo-mask PMb is rotated by 90 degrees and also the wafer is rotated by 90 degrees, for which reason the bit lines extend in the direction perpendicular to the direction along which the word lines extend even if the mask stage 105 and the wafer stage 108 are scanned in the X-direction and the opposite direction to the X-direction respectively.

As illustrated in FIG. 6B, the longitudinal direction of the bit line pattern Pb is the Y-direction and also the longitudinal direction of the slit SL is also in the Y-direction, for which reason even if a coma appears on the reduction projecting lens 107, this coma provides substantially no influence to the dimension of the width of the defined light beam transmitted through the slit SL because of a short distance from the optical axis in the width direction of the defined light beam defined by the slit, for which reason the bit line patterns are uniform in width over the entire regions of the wafer. Even if the comas at the opposite ends of the slit provide influences to the opposite ends of the bit line patterns Pb, the defined light beam transmitted by the slit SL is irradiated with superimposition by scanning, for which reason the influence of the comas are small in the scanning direction. Therefore, almost no influence is caused due to the comas to the width dimension of the bit line patterns Pb. Even if an influence is caused, then this influence is in the longitudinal direction of the bit line patterns Pb, whereby exposures in the opposite ends of the bit line patterns are insufficient, resulting in a slight shortening of the length of the bit line in the longitudinal direction. Usually, the opposite ends of the bit lines are not in service, for which reason no substantial influence is caused by the influence of comas in the opposite ends of the bit line patterns.

Consequently, the exposures of the word lines and the bit lines are carried out by scanning so that the longitudinal directions of the word lines and the bit lines are parallel to the longitudinal direction of the slit of the slit plate, for which reason almost no influence on the exposure is caused due to the comas of the reduced projecting lens 107. As a result, the word lines are uniform in width over the entire region of the chip, whereby channel lengths of MOS field effect transistors defined by the width of the word lines are also uniform over the entire region of the wafer surface, whereby the characteristics of the memory cells are also uniform over the entire region of the wafer. The bit lines are also uniform in width over the entire region of the chip, whereby the interconnections are also uniform in resistance over the entire region of the wafer surface, whereby currents of data read out from the memory cells are also uniform over the entire region of the wafer, resulting in an improvement in reliability of the data read out operations of the memory cells.

In the above embodiments, the word lines and the bit lines are taken as examples, but the present invention is applicable to any other slender patterns by use of the slit. For example, the invention is applicable to a photo-mask for interconnection patterns. The patterns are not limited to the straight shaped line. The longitudinal direction of the pattern is made to correspond to the longitudinal direction of the slit to utilize the present invention.

The above scanning exposure system is not limited to the above system. In accordance with the pattern shape, the slit direction may be rotated by 90 degrees so that the longitudinal direction of the slit is parallel to the X-direction and also the mask stage and the wafer stage are moved in the X-Y directions so that the photo-mask and the wafer are scanned in the Y-direction.

In accordance with the present invention, the longitudinal direction of the patterns of the photo-mask is parallel to the longitudinal direction of the slit so that an scanning and an exposure are carried out to make the longitudinal direction of the slit correspond to the longitudinal direction of the exposure pattern whereby influences of comas between center and end portions of a light beam defined by the slit are suppressed, resulting in almost no variation in dimension and shape of the patterns. This realizes highly accurate exposure and transfer of the patterns.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A scanning exposure system to expose an objective wafer, the system comprising:
   a light source;
   a slit plate with a slit-shaped window in optical alignment with said light source and having a length in a first direction greater than a width in a second direction, the second direction being perpendicular to the first direction;
   a photomask spaced apart from said slit plate with said slit-shaped window and having plural line-shaped exposure openings therein,
   said line-shaped exposure openings having a length along a longer direction greater than a width along a narrower direction perpendicular to said longer direction,
   said longer direction being aligned parallel to a projection of said first direction on said photomask,
   the objective wafer being exposed to said light source through said slit-shaped window and said exposure openings during a scanning operation by a relative motion of said photomask with respect to said slit-shaped window in a second direction perpendicular to said first direction, wherein the light source, the slit-shaped window, and the line-shaped exposure openings of the photomask are aligned so that scanning of the objective wafer is conducted with the longitudinal direction of the slit light parallel to the longitudinal direction of the line-shaped exposure openings, wherein all the exposure openings having a length along said longer first direction greater than a width along said narrower second direction, said longer first direction for each of said plurality of exposure openings being aligned parallel to said projection of said first direction on said photomask, and said all exposure openings being adjacently aligned with each other in said second direction.

2. The scanning exposure system of claim 1, wherein said relative motion during said scanning operation further comprises a relative motion of the objective wafer with respect to said slit-shaped window in a direction opposite said relative motion of said photomask with respect to said slit-shaped window.

3. The scanning exposure system of claim 1, further comprising a rotational driver unit to rotate the objective wafer about an axis normal to a surface of the objective wafer.

4. The scanning exposure system of claim 1, further comprising an X-Y driver unit to move the objective wafer in a plane parallel to a surface of the objective wafer.

5. A method of scanning an objective wafer with a light source to reduce a coma effect, the method comprising:

providing a first photomask having plural line-shaped exposure patterns therethrough, the line-shaped exposure patterns having a centerline aligned parallel to a projection of a longitudinal axis of a slit of an optical exposure system onto the first photomask;

providing a relative motion of the first photomask with respect to the slit in a scanning direction perpendicular to the longitudinal axis; and illuminating the objective wafer with the light source through the slit and the first photomask concurrently with said step of providing a relative motion of the first photomask so that the light source, the slit, and the line-shaped exposure patterns are aligned with the longitudinal direction of the slit light parallel to the longitudinal direction of the line-shaped exposure pattern, wherein said step of providing a first photomask comprises the step of providing the plurality of line-shaped exposure patterns each having a centerline aligned parallel to a projection of the longitudinal axis of the slit on the photomask.

6. The method of claim 5, further comprising the step of providing a relative motion of the objective wafer in a direction opposite to the scanning direction simultaneously with said step of providing a relative motion of the first photomask.

7. The method of claim 6, wherein the slit is fixed in position, and said step of providing a relative motion of the objective wafer in a direction opposite to the scanning direction comprises moving the objective wafer in a direction opposite to the scanning direction.

8. The method of claim 5, further comprising the steps of:

rotating the objective wafer 90 degrees about an axis normal to a surface of the objective wafer after said step of illuminating the objective wafer with the light source;

providing a second photomask having a second line-shaped exposure pattern therethrough, the line-shaped exposure pattern having a centerline aligned parallel to the projection of the longitudinal axis of the slit onto the second photomask;

providing a relative motion of the second photomask in the scanning direction with respect to the slit; and illuminating the rotated objective wafer with the light source through the slit and the second photomask concurrently with said step of providing a relative motion of the second photomask.

9. The method of claim 8, further comprising the step of providing a relative motion of the objective wafer in a direction opposite to the scanning direction simultaneously with said step of providing a relative motion of the second photomask.

10. The method of claim 5, wherein the slit is fixed in position, and said step of providing a relative motion of the first photomask with respect to the slit comprises moving the first photomask in the scanning direction.

* * * * *